(12) United States Patent
Ishii et al.

(10) Patent No.: US 12,007,437 B2
(45) Date of Patent: Jun. 11, 2024

(54) TEST METHOD

(71) Applicant: FUJI ELECTRIC CO., LTD., Kanagawa (JP)

(72) Inventors: Kenichi Ishii, Matsumoto (JP); Atsushi Yoshida, Matsumoto (JP); Tomonori Mori, Matsumoto (JP); Takashi Shiigi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 1 day.

(21) Appl. No.: 17/864,342

(22) Filed: Jul. 13, 2022

(65) Prior Publication Data

US 2023/0067428 A1 Mar. 2, 2023

(30) Foreign Application Priority Data

Sep. 1, 2021 (JP) ................................ 2021-142737

(51) Int. Cl.
*G01R 31/26* (2020.01)
*G01R 31/28* (2006.01)

(52) U.S. Cl.
CPC ..... *G01R 31/2894* (2013.01); *G01R 31/2856* (2013.01)

(58) Field of Classification Search
CPC ............ G01R 31/2608; G01R 31/2617; G01R 31/2856; G01R 31/2894; G01R 31/2837; G01R 31/275
See application file for complete search history.

(56) References Cited

U.S. PATENT DOCUMENTS 7,710,169 B2 * 5/2010 Tanaka ............... H03K 19/0005
326/85
2008/0062781 A1 * 3/2008 Cheng ..................... G11C 8/18
365/194

(Continued)

FOREIGN PATENT DOCUMENTS

CN 111812476 A 10/2020
CN 112595948 A 4/2021

(Continued)

OTHER PUBLICATIONS

Office Action issued for counterpart Japanese Application No. 2021-142737, transmitted from the Japanese Patent Office dated Aug. 8, 2023 (drafted on Jul. 25, 2023).

*Primary Examiner* — Thang X Le

(57) ABSTRACT

Provided is a test method of a semiconductor device under test, the test method comprising: controlling the semiconductor device under test to an on state by inputting a control signal to the semiconductor device under test; and observing the semiconductor device under test at a time of controlling the semiconductor device under test in the on state to an off state and evaluating the semiconductor device under test, wherein the semiconductor device under test includes one semiconductor device under test or a plurality of semiconductor devices under test, and in the controlling to the on state, a length of an on-time for which the one semiconductor device under test or the plurality of semiconductor devices under test are set to the on state is adjusted based on a magnitude of a variation in a delay time of the control signal.

21 Claims, 8 Drawing Sheets

(56) References Cited

U.S. PATENT DOCUMENTS

| | | | | |
|---|---|---|---|---|
| 2014/0157018 A1* | 6/2014 | Liu | ............................ | G06F 1/26 |
| | | | | 713/320 |
| 2017/0243541 A1* | 8/2017 | Tan | ........................ | H02M 3/156 |
| 2018/0045771 A1 | 2/2018 | Kim | | |
| 2021/0223317 A1* | 7/2021 | Scholz | ................ | G01R 31/3278 |

FOREIGN PATENT DOCUMENTS

| JP | 2009261079 A | 11/2009 |
|---|---|---|
| JP | 2010127720 A | 6/2010 |
| JP | 2010276477 A | 12/2010 |
| JP | 2017032323 A | 2/2017 |
| JP | 2020180800 A | 11/2020 |

\* cited by examiner

TEST METHOD

The contents of the following Japanese patent application are incorporated herein by reference:
NO. 2021-142737 filed in JP on Sep. 1, 2021.

BACKGROUND

1. Technical Field

The present invention relates to a test method of a semiconductor device.

2. Related Art

In the related art, known is a method of testing a semiconductor device such as a transistor (for example, refer to Patent Document 1).
Patent Document 1: Japanese Patent Application Publication No. 2010-276477

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are essential to the solution of the invention.

As used herein, one side in a direction parallel to a depth direction of a semiconductor substrate (or a semiconductor device) is referred to as 'upper' and the other side is referred to as 'lower'. One surface of two principal surfaces of a substrate, a layer or other member is referred to as 'upper surface', and the other surface is referred to as 'lower surface'. The 'upper' and 'lower' directions are not limited to a gravity direction or a direction at a time of mounting a semiconductor device.

As used herein, the description 'same' or 'equal' may also include a case where there is an error due to manufacturing variation and the like. The error is, for example, within 10%.

Figure 1:
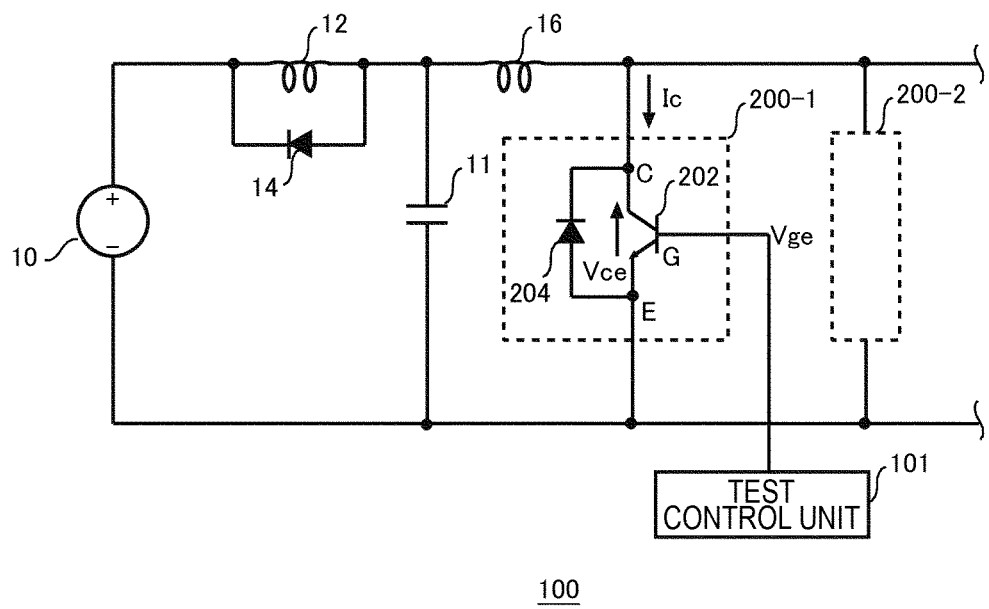
FIG. 1 shows an outline of a test device 100 for testing a semiconductor device 200, according to one embodiment of the present invention.

FIG. 1 shows an outline of a test device 100 for testing a semiconductor device 200, according to one embodiment of the present invention. In the present example, the semiconductor device 200 includes a transistor unit 202, and a diode unit 204. The transistor unit 202 includes, for example, an IGBT (Insulated Gate Bipolar Transistor) element, but may include other transistors. The diode unit 204 is a freewheeling diode connected in antiparallel to the transistor unit 202. In the present example, the semiconductor device 200 is a so-called reverse conducting IGBT (RC-IGBT). In the present specification, a current flowing through a collector terminal C of the transistor unit 202 is denoted as Ic, a voltage between an emitter terminal E and the collector terminal C of the transistor unit 202 is denoted as Vce, and a voltage applied to a gate terminal G of the transistor unit 202 is denoted as Vge.

The test device 100 is configured to test one or a plurality of semiconductor devices 200 (which may be referred to herein as the semiconductor devices under test). Each of the one or the plurality of semiconductor devices 200 may be configured by one chip including the transistor unit 202 and the diode unit 204, or may also be configured by two chips, a chip including the transistor unit 202 and a chip including the diode unit 204. When testing the semiconductor device 200, the semiconductor device may be in a state of a wafer on which a plurality of chips are formed, or may also be in a state of a chip cut out from the wafer. In addition, the semiconductor device may be in a state of a device (module) where one or more semiconductor devices 200 and wires and terminals connected to the semiconductor devices 200 are accommodated in a case made of resin or the like. In the test device 100, a plurality of semiconductor devices 200 (200-1, 200-2) may be connected in parallel. For example, in a state of the module, a plurality of semiconductor devices 200 connected in parallel are arranged in the module. The test device 100 is configured to supply a voltage and a current to the semiconductor device 200 under a predetermined condition, and to determine a quality of the semiconductor device 200, based on operations of the semiconductor device 200. The test device 100 may be configured to measure at least one of the voltage Vce or the current Ic in the semiconductor device 200.

The test device 100 includes a test control unit 101, a power supply 10, a capacitor 11, a coil 12, a coil 16, and a diode 14. The test control unit 101 is configured to supply the gate voltage Vge to each of the semiconductor devices 200. The test control unit 101 may be configured to apply the same gate voltage Vge to the plurality of semiconductor devices 200. In addition, the test control unit 101 may be configured to measure the voltage Vce and the current Ic of each of the semiconductor devices 200.

The power source 10 is configured to generate electric power to be supplied to one or more semiconductor devices 200. The capacitor 11 is a capacitor for stabilizing the power supply. The coil 12 is arranged between the power supply 10 and the collector terminal of the semiconductor device 200. The coil 16 is arranged between the coil 12 and the collector terminal of the semiconductor device 200. The diode 14 is connected parallel to the coil 12. When the semiconductor device 200 is turned off, the diode 14 causes the current flowing through the semiconductor device 200 to flow back toward the power supply 10. The coil 12, the coil 16 and the diode 14 may be provided in common for the plurality of semiconductor devices 200.

In addition, the coil 16 may be configured to be able to adjust a value of an inductive component. For example, the test device 100 may include a plurality of coils 16 having different values of inductive components in parallel, and may include a switch for selecting the coil 16 to be connected between the coil 12 and the semiconductor device 200. By adjusting the inductive component of the coil 16, it is possible to adjust a slope of a waveform of the current Ic of the semiconductor device 200.

In the present example, the test control unit 101 is configured to determine a quality of the semiconductor device 200, based on operations of the semiconductor device 200 at a time of turning off the semiconductor device 200. The test control unit 101 may be configured to determine the quality of the semiconductor device 200, based on a waveform of at least one of the current Ic or the voltage Vce of the semiconductor device 200.

In the present example, the test control unit 101 is configured to test a reverse bias safety operation area (RB-SOA) of the semiconductor device 200. In the present example, the test control unit 101 may be configured to determine whether the current Ic and the voltage Vce at the time of turning off the semiconductor device 200 in which a predetermined test current is flowing change within a predetermined range. The test control unit 101 may also be configured to determine whether a magnitude or the like of the surge of the voltage Vce at the time of turn-off satisfies a predetermined criterion.

Figure 2:
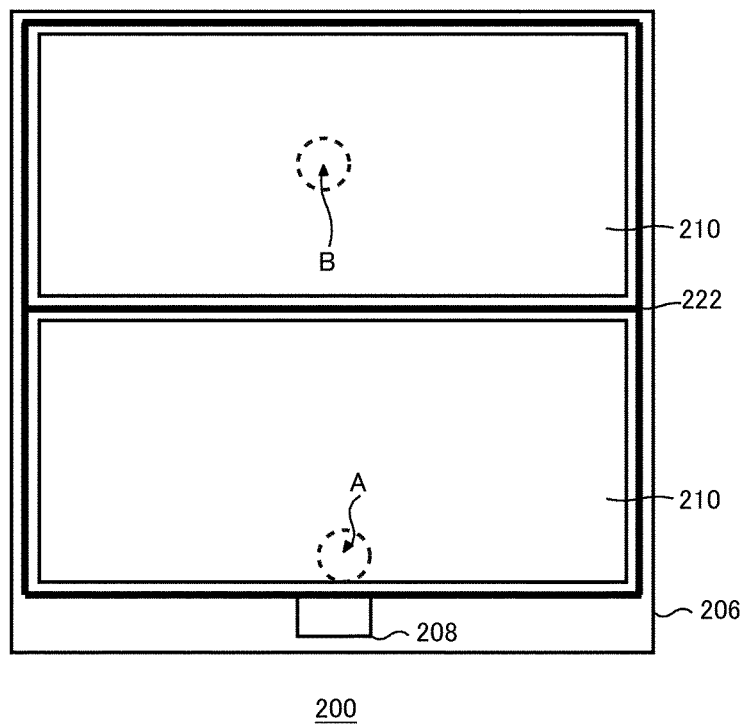
FIG. 2 shows an outline of an upper surface structure of the semiconductor device 200.

FIG. 2 shows an outline of an upper surface structure of the semiconductor device 200. In FIG. 2, a chip-shaped semiconductor device 200 is shown. The semiconductor device 200 has a semiconductor substrate 206. The semiconductor substrate 206 is a substrate formed of a semiconductor material such as silicon.

The upper surface of the semiconductor substrate 206 is provided with an upper surface pad 210, a control pad 208, and a gate runner 222. The upper surface pad 210 is an electrode that is connected to the emitter terminal E of the transistor unit 202. The semiconductor substrate 206 below the upper surface pad 210 is provided with the transistor unit 202 and the diode unit 204. In addition, a lower surface of the semiconductor substrate 206 may be provided with a lower surface pad that is connected to the collector terminal C of the transistor unit 202. In the present example, the semiconductor device 200 is a vertical device in which a current flows between the upper surface pad 210 and the lower surface pad when controlled to an on state. In another example, the semiconductor device 200 may also be a horizontal device in which both the two pads are arranged on the upper surface.

The control pad 208 is an electrode that is connected to the gate terminal G of the transistor unit 202. A gate voltage Vge is applied to the control pad 208 from the test control unit 101. The upper surface pad 210 and the control pad 208 may be formed of a metal material such as aluminum.

The gate runner 222 is configured to connect the control pad 208 and the gate terminal G of the transistor unit 202 to each other. The gate runner 222 may be formed of a metal material such as aluminum or may be formed of polysilicon to which impurities are added. In the present example, the gate runner 222 has a portion arranged to surround the upper surface pad 210 and a portion arranged to divide the upper surface pad 210. The gate terminal of the transistor unit 202 is connected to any portion of the gate runner 222.

When testing a characteristic of the semiconductor device 200 at the time of turn-off, it is preferable to turn off the semiconductor device 200 in a state where the current substantially uniformly flows in the upper surface of the semiconductor device 200. If a variation occurs in an in-plane current, a phenomenon such as latch-up cannot be sufficiently observed in a region where the current is small, for example.

Before turning off the semiconductor device 200, if a period in which the semiconductor device 200 is on is not sufficient, a variation tends to occur in the in-plane current of the semiconductor device 200. For example, a variation may occur in a delay time of the gate voltage Vge, depending on a path length of the gate runner 222 from the control pad 208. For this reason, in a region A close to the control pad 208, the transistor unit 202 starts to turn on early, whereas in a region B distant from the control pad 208, turn-on of the transistor unit 202 is delayed. Therefore, within a predetermined period after the semiconductor device 200 is turned on, a variation tends to occur in the in-plane current of the semiconductor device 200.

Figure 3:
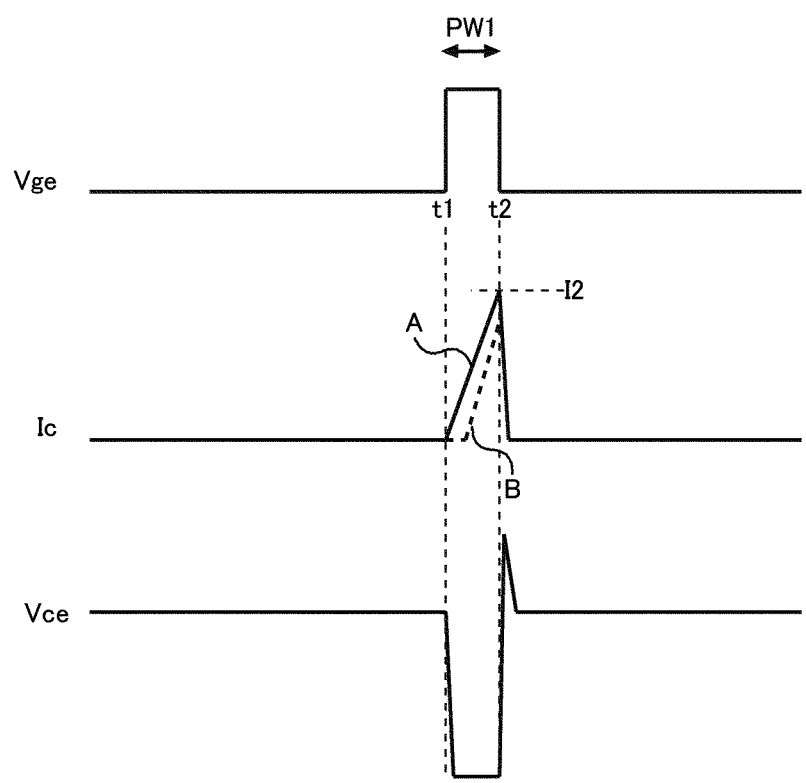
FIG. 3 shows waveforms of a gate voltage Vge, a current Ic and a voltage Vce of the semiconductor device 200 according to a reference example.

FIG. 3 shows waveforms of the gate voltage Vge, the current Ic and the voltage Vce of the semiconductor device 200 according to a reference example. In FIG. 3, the horizontal axis represents time and the vertical axis represents a magnitude of the voltage or current.

At time t1, the gate voltage Vge for turning on the semiconductor device 200 is applied. The current Ic starts to flow, according to the gate voltage Vge. In addition, the semiconductor device 200 becomes conductive, so that the voltage Vce between the emitter and the collector is lowered.

However, as described with reference to FIG. 2, the current tends to vary in each in-plane region of the semiconductor device 200, within a predetermined period from time t1. In FIG. 3, the current Ic in the region A is shown by a solid line, and the current Ic in the region B is shown by a broken line. For example, in the transistor unit 202 of the region B, the transmission of the gate voltage Vge is delayed, so that the current Ic becomes smaller than that in the region A.

In the RBSOA test, the semiconductor device 200 is turned off in a state where a predetermined test current I2 is caused to flow through the semiconductor device 200. The test control unit 101 determines whether the semiconductor device 200 can operate within a predetermined voltage and current range, based on the waveforms of the current Ic and the voltage Vce after the semiconductor device 200 is turned off.

In the example of FIG. 3, the semiconductor device 200 is turned off at time t2 at which a predetermined on-time PW1 has elapsed from the time t1. However, as shown in FIG. 3, when the on-time PW1 is short, the current Ic in the region B does not reach the predetermined test current I2, so that it is not possible to accurately test the transistor unit 202 and the diode unit 204 in the region B.

In the examples of FIGS. 2 and 3, the variation in the in-plane current Ic of one semiconductor device 200 has been described. However, when testing a plurality of semiconductor devices 200 in parallel, the variation in the current Ic may also occur among the semiconductor devices 200. For example, when there is a variation in transmission delay of the gate voltage Vge to each of the semiconductor devices 200, a variation occurs in the current Ic flowing through each of the semiconductor devices 200. Also in this case, when the on-time PW1 of each of the semiconductor devices 200 is short, there is a semiconductor device 200 in which the current Ic does not reach the predetermined test current I2, so that the semiconductor device 200 may not be able to be accurately tested.

Figure 4:
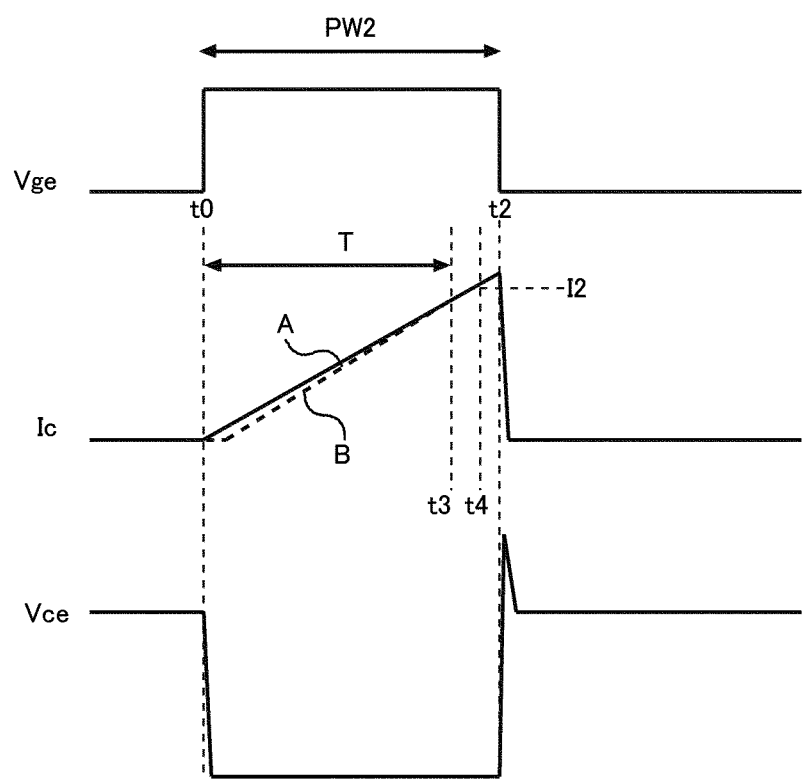
FIG. 4 shows waveforms of a gate voltage Vge, a current Ic and a voltage Vce of the semiconductor device 200 according to one embodiment of the present invention.

FIG. 4 shows waveforms of the gate voltage Vge, the current Ic and the voltage Vce of the semiconductor device 200 according to one embodiment of the present invention. At time t0, the test control unit 101 inputs a control signal (gate voltage Vge, in the present example) to one or more semiconductor devices 200 to control the semiconductor devices 200 to an on state. The test control unit 101 turns off each of the semiconductor devices 200 at time t2 at which a predetermined on-time PW2 has elapsed from the time t0. The test control unit 101 performs the RBSOA test depending on whether the voltage Vce and the current Ic of the semiconductor device 200 after the turn-off are within a predetermined range.

The test control unit 101 of the present example adjusts a length of the on-time PW2, based on a magnitude of the variation in the delay time of the gate voltage Vge among a plurality of regions (for example, regions A and B) in one semiconductor device 200 or among the plurality of semiconductor devices 200. The larger the variation in the delay time is, a time until the current Ic in the semiconductor device 200 or among the plurality of semiconductor devices 200 becomes substantially uniform becomes longer. For this reason, the test control unit 101 makes the on-time PW2 longer as the variation in the delay time is larger.

The variation in the delay time of the gate voltage Vge may be obtained by actually measuring the delay time of the gate voltage Vge, or may be estimated by another method. For example, when an area of the upper surface of the semiconductor device 200 is large, a difference in the path length of the gate runner 222 for each in-plane region becomes large, so that the variation in the delay time can be estimated to become large.

In addition, a test may be performed on a reference semiconductor device, in which a defect was created in advance, by changing an on-time PW, and a magnitude of the variation in the delay time may be estimated from a defect detection ratio (a ratio that a defect was detected) for each on-time PW. For example, when a sufficiently long on-time PW is set with respect to the variation in the delay time, the defect detection ratio for the reference semiconductor device in which a defect was created in advance is almost 100%. On the other hand, when the on-time PW is not sufficient with respect to the variation in the delay time, the defect detection ratio decreases. Therefore, by detecting a magnitude of the on-time PW for which a predetermined defect detection ratio can be realized, a magnitude of the variation in the delay time can be evaluated.

In the example of FIG. 4, the current Ic in the region A and the current Ic in the region B become substantially uniform at time t3. The time after turn-on until the in-plane current Ic of the semiconductor device 200 (or current Ic among the plurality of semiconductor devices 200) becomes uniform in this way is denoted as T. The description 'current is uniform' indicates a state where the variation in the current value, for example, is 20% or less. The time T changes according to a magnitude of the variation in the delay time. By setting the on-time PW2 to the time T or longer, the test control unit 101 uniformizes the current Ic of each region of the semiconductor device 200 or each semiconductor device 200 at a turn-off timing (time t2). Thereby, the test of the semiconductor device 200 can be performed with high accuracy. The test control unit 101 may set the on-time PW2 to 100 µs or longer or 130 µs or longer. The test control unit 101 may set the on-time PW2 to 150 µs or shorter. If the on-time PW2 is too longer than the time T, the efficiency of the test will decrease. The on-time PW2 may be 2 times or less, 1.5 times or less or 1.2 times or less as long as the time T.

Note that, the test control unit 101 preferably adjusts the value of the inductive component of the coil 16 so that the current Ic of each region of the semiconductor device 200 or each semiconductor device 200 can reach the predetermined test current I2 within the on-time PW2. The test control unit 101 may adjust the value of the inductive component of the coil 16 based on the time T so that the current Ic of each region of the semiconductor device 200 or each semiconductor device 200 can reach the predetermined test current I2 at time t4 after time t3. Note that, the times t2, t3 and t4 may be the same time. That is, the inductive component of the coil 16 may be adjusted so that each current Ic reaches the test current I2 at a timing at which the time T has elapsed from time t0. Further, the semiconductor device 200 may be turned off at the timing. Thereby, the test time can be shortened.

Figure 5:
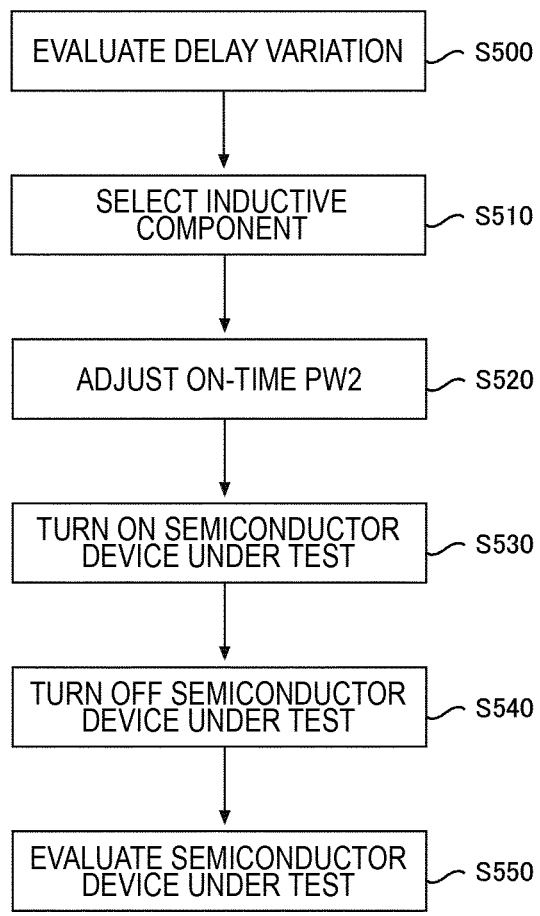
FIG. 5 is a chart diagram showing an outline of a test method by the test device 100.

FIG. 5 is a chart diagram showing an outline of a test method by the test device 100. The test method of the present example is similar to the test by the test device 100 described with reference to FIGS. 1 to 4. First, in a delay evaluation step S500, the test control unit 101 evaluates the delay variation of the gate voltage Vge in a plane of the semiconductor device 200 or among the plurality of semiconductor devices 200. As described above, the test control unit 101 may measure the delay time itself, or may evaluate the variation in the delay time by using other parameters (for example, the defect detection ratio described above) that vary according to the magnitude of the delay variation. In addition, the test control unit 101 may evaluate the magnitude of the variation in the delay time from the variation in the current flowing through the semiconductor device 200. For example, the test control unit 101 may measure the time T described with reference to FIG. 4.

Next, in an inductive component selection step S510, the test control unit 101 selects the inductive component of the coil 16, according to the magnitude of the variation in the delay time evaluated in S500. As described above, the test device 100 is provided with the plurality of coils 16 having different values of inductive components so as to be selectable. The test control unit 101 selects the coil 16 where the current Ic reaches the predetermined test current I2 after time t3. The test control unit 101 selects the coil 16 where time t4 at which the current Ic reaches the predetermined test current I2 is after time t3 and is closest to time t3. Thereby, it is possible to prevent the test time from becoming excessively long.

Next, in an on-time adjustment step S520, the test control unit 101 sets the on-time PW2 so that the semiconductor device 200 is turned off after time t4 at which the current Ic reaches the predetermined test current I2. The test control unit 101 may set the on-time PW2 so that the semiconductor device 200 is turned off at time t4, or may set the on-time PW2 so that the semiconductor device 200 is turned off at time t2 at which a predetermined margin time has elapsed with respect to time t4.

The test control unit 101 may adjust the on-time PW2, based on a maximum value of the delay time of the gate voltage Vge in the semiconductor device 200. That is, the test control unit 101 may adjust the on-time PW2 and the inductive component of the coil 16 so that the current Ic equivalent to that of another region flows within the on-time PW2 even in the region where the gate voltage Vge reaches the latest. The test control unit 101 may set the on-time PW2 so that the variation in the in-plane current of the semiconductor device 200 at a time (time t2) when the on-time PW2 has elapsed is 20% or less.

Next, in an on-step S530, the test control unit 101 applies the gate voltage Vge that controls one or more semiconductor devices 200 to the on state. In the on-step S530, the semiconductor device 200 is controlled to the on state by using the coil 16 set in S510 and the on-time PW2 set in S520.

At a timing at which the on-time PW2 has elapsed, the test control unit 101 controls the semiconductor device 200 in the on state to the off state (off-step S540). Then, in an evaluation step S550, the test control unit 101 observes the semiconductor device 200 at a time when the semiconductor device 200 in the on state is controlled to the off state, and evaluates the semiconductor device 200. For example, the test control unit 101 determines a quality of the semiconductor device 200, based on whether the voltage Vce and the current Ic after the semiconductor device 200 is turned off change within a predetermined range.

According to the test method of the present example, the semiconductor device 200 can be turned off in a state where the substantially uniform current Ic is caused to flow in a plane of the semiconductor device 200 or through the plurality of semiconductor devices 200. For this reason, the semiconductor device 200 can be evaluated with high accuracy.

Figure 6:
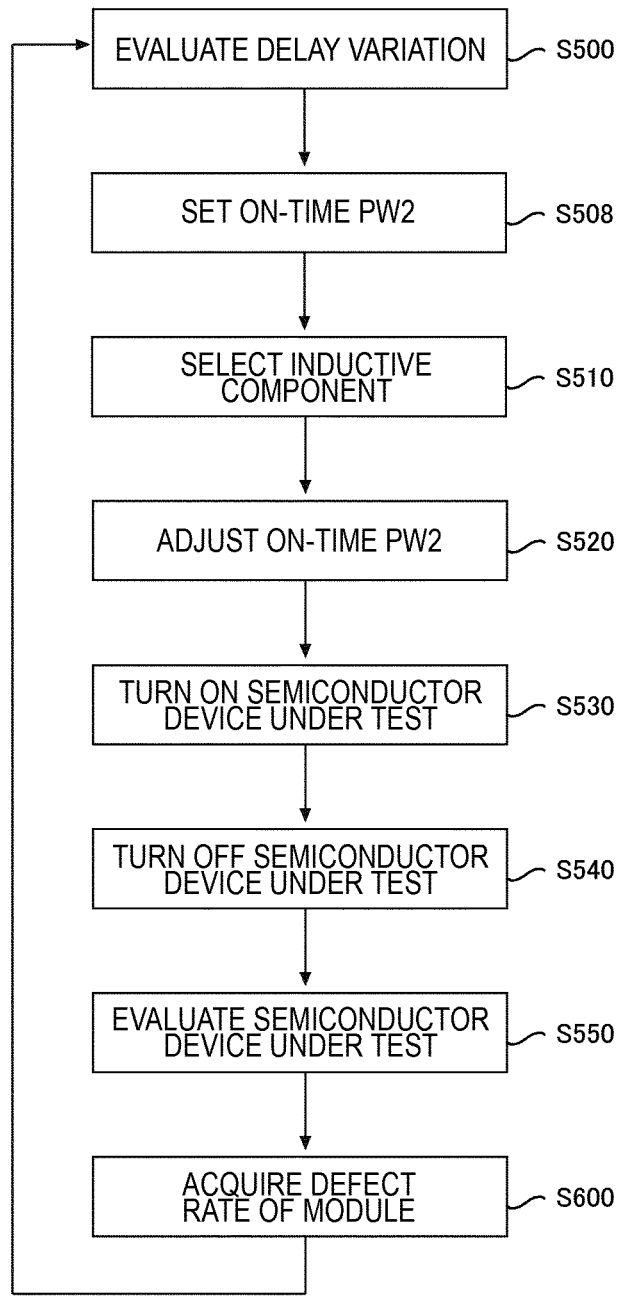
FIG. 6 is a chart diagram showing another example of the test method by the test device 100.

FIG. 6 is a chart diagram showing another example of the test method by the test device 100. The test method of the present example further includes an on-time setting step S508 and a module defect acquisition step S600, in addition to each step of the test method shown in FIG. 5.

The semiconductor device 200 in a chip state determined as being non-defective in the evaluation step S550 may be incorporated in a module. The module is a device where one or more semiconductor devices 200 and wires and terminals connected to the semiconductor devices 200 are accommodated in a case made of resin or the like.

In the module defect acquisition step S600, a defect rate that occurs in the module in which the semiconductor device 200 determined as being non-defective is incorporated is acquired. The defect rate is a ratio of the number of failure modules in which the semiconductor device 200 has failed to the total number of modules. Note that, a module in which the incorporated semiconductor device 200 has failed at the time of turn-off may be counted as a failure module. When the defect rate of the module is high, there is a high possibility that the on-time PW2 in the on-step S530 is not sufficient. When the defect rate of the module is higher, the test control unit 101 may set the on-time PW2 longer in the on-time setting step S508. The module defect rate may be acquired by testing the modules before shipment, or a rate that the modules after shipment have failed during use may be acquired.

In addition, the test control unit 101 may perform the tests of S530 to S550 in a state where a plurality of groups of the semiconductor devices 200 are prepared and different on-times PW2 are assigned to the respective groups. Then, the semiconductor device 200 determined as being non-defective in each group may be incorporated into the module, and a module non-defective rate in each group may be acquired. Thereby, a correlation between the on-time PW2 and the defect rate of the module can be acquired. The test control unit 101 may adjust the on-time PW2 so that the defect rate of the module is within a predetermined allowable range.

Figure 7:
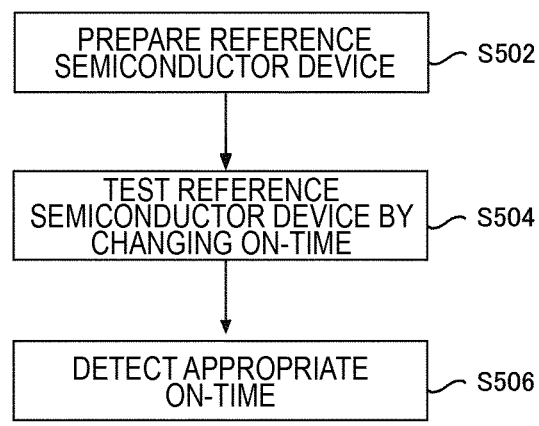
FIG. 7 is a chart diagram showing another example of a delay evaluation step S500.

FIG. 7 is a chart diagram showing another example of the delay evaluation step S500. In the present example, a plurality of reference semiconductor devices having defects formed in advance are prepared. The reference semiconductor device is a device that is used to set the on-time PW2 in the test of the semiconductor device 200. The reference semiconductor device preferably has the same structure as the semiconductor device 200 except the defect.

The defect is a defect by which the reference semiconductor device is determined as being defective by performing the RBSOA test, for example. As an example, the defect may be formed by causing an impurity density in an impurity region formed in the semiconductor substrate 206 to deviate from the specification value. For example, the defect may be formed by setting an impurity density of a P-type impurity region so that a latch-up can easily occur in the transistor unit 202. The defect may be formed in a region where the transmission delay time of the gate voltage Vge is the largest.

Next, in a test step S504, the reference semiconductor devices are divided into a plurality of groups, and different on-times PW are set for the respective groups. In the test step S504, the similar test to S530 to S550 in FIG. 5 is performed. Thereby, for each on-time PW, the defect rate of the reference semiconductor device can be acquired.

Next, in an on-time detection step S506, an on-time PW for which the defect rate of the reference semiconductor device is equal to or larger than a predetermined value is detected. The predetermined value may be equal to or larger than 90%, or may be 100%. By using the detected on-time PW, the semiconductor device 200 having a defect can be detected with a probability corresponding to the defect rate.

The on-time PW detected in the on-time detection step S506 may be used as the on-time PW2 in the on-step S530 for the semiconductor device 200. In addition, the on-time PW detected in the on-time detection step S506 may be handled as the time T required for the current Ic to become substantially uniform. The test control unit 101 may perform the processing from S508 to S520 with the on-time PW as the time T.

Figure 8:
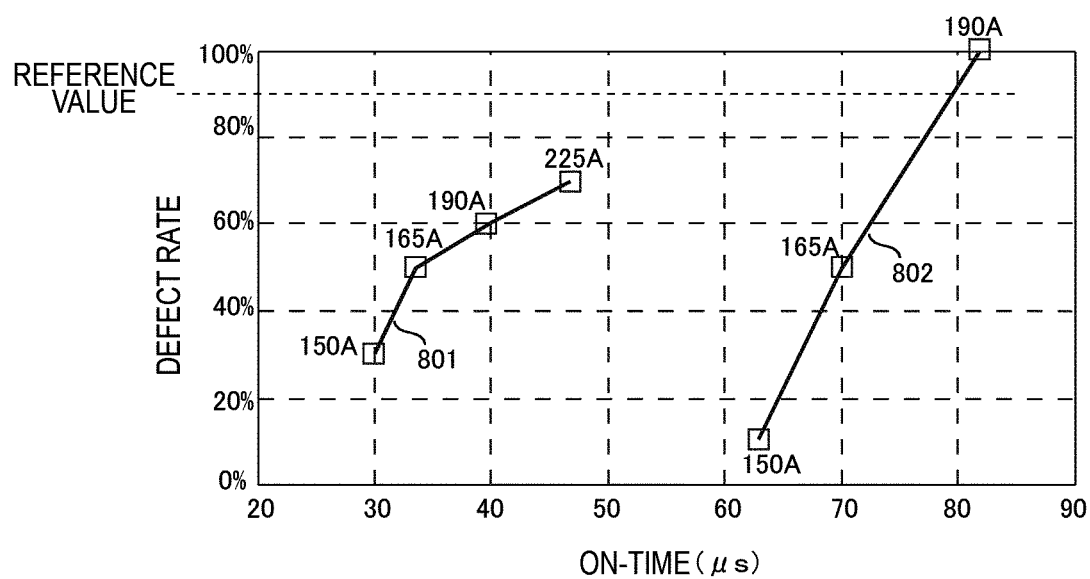
FIG. 8 illustrates an example of a test step S504.

FIG. 8 illustrates an example of the test step S504. In FIG. 8, the defect rate of one group of the reference semiconductor devices is plotted with one square mark. A group included in a graph 801 is a group having a relatively short on-time PW (about 30 µs to 50 µs), and a group included in a graph 802 is a group having a relatively long on-time PW (about 60 µs to 85 µs). In addition, for the group included in the graph 801, the inductive component of the coil 16 is L=200 µH, and for the group included in the graph 802, the inductive component of the coil 16 is L=400 µH. That is, a slope of the current Ic in the group included in the graph 802 is gentler than a slope of the current Ic in the group included in the graph 801.

In addition, the value of the current Ic at a time when the on-time PW has elapsed is shown in the vicinity of each plot. Since the same coil 16 is used in the same group, the current Ic increases as the on-time PW becomes longer.

As shown in FIG. 8, when the on-time PW is short, even if the current Ic at the time of turn-off is increased, the defect rate does not reach 80%. Note that, if the on-time PW and the current Ic are further increased in the graph 801, heat generation at a contact point between a probe of the test device 100 and an electrode of the reference semiconductor device increases, and the reference semiconductor device breaks down at the contact point.

As shown in the graph 802, when the coil 16 having a certain or more inductive component is used, the defect rate of the reference semiconductor device becomes a reference value or more (for example, 100%) by appropriately setting the on-time PW. It is thought that the reason is that the defect of the reference semiconductor device could be detected appropriately by setting the timing at which the current Ic reaches a predetermined test current (for example, 190A) is set later than the timing at which the in-plane current Ic of the reference semiconductor device becomes substantially uniform and securing the on-time PW for which the current Ic can reach the predetermined test current.

The test control unit 101 may detect the on-time PW for which the defect rate exceeds the reference value by performing measurement as shown in FIG. 8. The test control unit 101 may use the detected on-time PW in the test of the semiconductor device 200, which is the semiconductor device under test. Thereby, the defect of the semiconductor device 200 can be detected with high accuracy.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A test method of a semiconductor device under test, the test method comprising:
    controlling the semiconductor device under test to an on state by inputting a control signal to the semiconductor device under test; and
    observing the semiconductor device under test at a time of controlling the semiconductor device under test in the on state to an off state and evaluating the semiconductor device under test,
    wherein the semiconductor device under test includes one semiconductor device under test or a plurality of semiconductor devices under test, and
    in the controlling to the on state, a length of an on-time for which the one semiconductor device under test or the plurality of semiconductor devices under test are set to the on state is adjusted based on a magnitude of a variation in a delay time of the control signal among a plurality of regions in one of the one or the plurality of semiconductor devices under test or among the plurality of semiconductor devices under test.

2. The test method according to claim 1, wherein
    in the controlling to the on state, a time of the on state is adjusted based on a maximum value of the delay time of the control signal.

3. The test method according to claim 1, wherein
    the larger of the variation in the delay time is, the longer of the on-time is set.

4. The test method according to claim 1, adjusting an inductive component connected in series with the semiconductor device under test, according to a time after the semiconductor device under test is controlled to the on state until a variation in a current flowing through the plurality of regions or a current flowing through the plurality of semiconductor devices under test becomes equal to or smaller than a constant value.

5. The test method according to claim 4, adjusting the inductive component so that the current flowing through the semiconductor device under test reaches a predetermined value of a test current, after a timing until the variation in the current becomes equal to or smaller than the constant value.

6. The test method according to claim 1, further comprising acquiring a defect rate of a module when the semiconductor device under test in a chip state determined as being non-defective in the evaluating is incorporated into the module, wherein
    in the controlling to the on state, the on-time is adjusted based on the defect rate of the module.

7. The test method according to claim 1, wherein
    in the controlling to the on state, the on-time is set to at least 100 μs.

8. The test method according to claim 1, wherein
    in the controlling to the on state, the on-time is set so that a variation in an in-plane current of the semiconductor device under test at a time when the on-time elapses becomes 20% or less.

9. The test method according to claim 1,
    performing the controlling to the on state by varying the on-time for a plurality of reference semiconductor devices having defects formed in advance,
    detecting the on-time for which a defect rate in the evaluating for the plurality of reference semiconductor devices becomes equal to or larger than a reference value, and
    adjusting the on-time in the controlling to the on state for the semiconductor device under test, based on the detected on-time.

10. The test method according to claim 2, wherein
    the larger of the variation in the delay time is, the longer of the on-time is set.

11. The test method according to claim 2, adjusting an inductive component connected in series with the semiconductor device under test, according to a time after the semiconductor device under test is controlled to the on state until a variation in a current flowing through the plurality of regions or a current flowing through the plurality of semiconductor devices under test becomes equal to or smaller than a constant value.

12. The test method according to claim 3, adjusting an inductive component connected in series with the semiconductor device under test, according to a time after the semiconductor device under test is controlled to the on state until a variation in a current flowing through the plurality of regions or a current flowing through the plurality of semiconductor devices under test becomes equal to or smaller than a constant value.

13. The test method according to claim 2, further comprising acquiring a defect rate of a module when the semiconductor device under test in a chip state determined as being non-defective in the evaluating is incorporated into the module, wherein
    in the controlling to the on state, the on-time is adjusted based on the defect rate of the module.

14. The test method according to claim 3, further comprising acquiring a defect rate of a module when the semiconductor device under test in a chip state determined as being non-defective in the evaluating is incorporated into the module, wherein
    in the controlling to the on state, the on-time is adjusted based on the defect rate of the module.

15. The test method according to claim 4, further comprising acquiring a defect rate of a module when the semiconductor device under test in a chip state determined as being non-defective in the evaluating is incorporated into the module, wherein
    in the controlling to the on state, the on-time is adjusted based on the defect rate of the module.

16. The test method according to claim 5, further comprising acquiring a defect rate of a module when the semiconductor device under test in a chip state determined as being non-defective in the evaluating is incorporated into the module, wherein
    in the controlling to the on state, the on-time is adjusted based on the defect rate of the module.

17. The test method according to claim 2, wherein
    in the controlling to the on state, the on-time is set to at least 100 μs.

18. The test method according to claim 3, wherein
in the controlling to the on state, the on-time is set to at least 100 µs.

19. The test method according to claim 4, wherein
in the controlling to the on state, the on-time is set to at least 100 µs.

20. The test method according to claim 5, wherein
in the controlling to the on state, the on-time is set to at least 100 µs.

21. The test method according to claim 1, further comprising:
evaluating the magnitude of the variation in the delay time of the control signal.

* * * * *